(12) United States Patent
Kou

(10) Patent No.: US 9,780,796 B2
(45) Date of Patent: *Oct. 3, 2017

(54) TIMING RECOVERY FOR DIGITAL RECEIVER WITH INTERLEAVED ANALOG-TO-DIGITAL CONVERTERS

(71) Applicant: eTopus Technology Inc., Sunnyvale, CA (US)

(72) Inventor: Yu Kou, San Jose, CA (US)

(73) Assignee: eTopus Technology Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/271,096

(22) Filed: Sep. 20, 2016

(65) Prior Publication Data

US 2017/0012630 A1 Jan. 12, 2017

Related U.S. Application Data

(63) Continuation of application No. 14/727,673, filed on Jun. 1, 2015, now Pat. No. 9,461,654.

(51) Int. Cl.
*H03L 7/08* (2006.01)
*H04L 7/00* (2006.01)
(Continued)

(52) U.S. Cl.
CPC ............ *H03L 7/0807* (2013.01); *H03L 7/091* (2013.01); *H03L 7/093* (2013.01); *H03L 7/146* (2013.01);
(Continued)

(58) Field of Classification Search
CPC ....... H03L 7/0807; H03L 7/148; H03L 7/093; H03L 7/097; H03L 7/091; H03L 7/146;
(Continued)

(56) References Cited

U.S. PATENT DOCUMENTS 5,294,926 A * 3/1994 Corcoran ............ H03M 1/1061
341/118
7,642,939 B2 * 1/2010 Nanevicz ................ H03M 9/00
341/101

(Continued)

OTHER PUBLICATIONS

Chen, E-H. et al., "Power Optimized ADC-Based Serial Link Receiver," IEEE Journal of Solid-State Circuits, Apr. 2012, pp. 938-951, vol. 47, No. 4.

(Continued)

*Primary Examiner* — Freshteh N Aghdam
(74) *Attorney, Agent, or Firm* — Fenwick & West LLP

(57) ABSTRACT

A receiver having analog to digital converters with phase adjustable sampling clocks. A first analog to digital converter converts an analog signal into first digital samples under control of a first sampling clock. A first clock generator adjusts a phase of the first sampling clock based on at least one first phase control signal. A second analog to digital converter converts the analog signal into second digital samples under control of a second sampling clock. A second clock generator adjusts the phase of the second sampling clock based on at least one second phase control signal. A data decision circuit recovers data based on the first and second samples. Feedback circuitry receives the recovered data and generates at least one first phase control signal for the first clock generator and generates at least one second phase control signal for the second clock generator based on the first phase control signal.

9 Claims, 7 Drawing Sheets

(51) Int. Cl.
*H03M 1/06* (2006.01)
*H03L 7/091* (2006.01)
*H03L 7/093* (2006.01)
*H03L 7/14* (2006.01)
*H04L 7/033* (2006.01)
*H03M 1/12* (2006.01)

(52) U.S. Cl.
CPC ........ *H03M 1/0624* (2013.01); *H04L 7/0016* (2013.01); *H04L 7/0062* (2013.01); *H04L 7/0079* (2013.01); *H04L 7/0331* (2013.01); *H03M 1/1215* (2013.01)

(58) Field of Classification Search
CPC ... H04L 7/0016; H04L 7/0079; H04L 7/0062; H04L 7/0331; H03M 1/0624; H03M 1/1215
See application file for complete search history.

(56) References Cited

U.S. PATENT DOCUMENTS

| | | |
|---|---|---|
| 7,688,237 B2 | 3/2010 | Cao et al. |
| 7,852,253 B2 | 12/2010 | Bien et al. |
| 8,111,178 B2 | 2/2012 | Liao et al. |
| 8,349,919 B2 | 1/2013 | Breen |
| 9,264,059 B2 * | 2/2016 | Tousi ................... H03M 1/1038 |
| 9,397,680 B2 | 7/2016 | Xu et al. |
| 9,461,654 B1 | 10/2016 | Kou |
| 2001/0052864 A1 * | 12/2001 | Shimizu .............. H03M 1/0673 341/141 |
| 2003/0063020 A1 | 4/2003 | Masenas et al. |
| 2003/0194028 A1 | 10/2003 | Jeffers et al. |
| 2005/0219091 A1 * | 10/2005 | Wood ................... H03M 1/1085 341/120 |
| 2007/0086544 A1 | 4/2007 | Fudge et al. |
| 2009/0161798 A1 * | 6/2009 | Wong ....................... H04B 1/16 375/340 |
| 2009/0261862 A1 | 10/2009 | Nguyen et al. |
| 2010/0061490 A1 | 3/2010 | Noeldner |
| 2010/0074078 A1 * | 3/2010 | Cao ....................... G11B 5/5565 369/53.17 |
| 2010/0226031 A1 | 9/2010 | Dziak et al. |
| 2013/0057417 A1 | 3/2013 | Bonaccio et al. |

OTHER PUBLICATIONS

Parhi, K.K., "Design of Multigigabit Multiplexer-Loop-Based Decision Feedback Equalizers," IEEE Transactions on Very Large Scale Integration (VLSI) Systems, Apr. 2005, pp. 489-493, vol. 13, No. 4.

Cao, J. et al., "A 500 mW ADC-Based CMOS AFE with Digital Calibration for 10 Gb/s Serial Links Over KR-Backplane and Multimode Fiber," IEEE Journal of Solid-State Circuits, Jun. 2010, pp. 1172-1185. vol. 45, No. 6.

Takemoto, T. et al., "100-Gbps CMOS Transceiver for Multilane Optical Backplane Systems with 1.3 cm.sup.2 Footprint," Optics Express, Dec. 12, 2011, pp. B777-B783, vol. 19, No. 26.

United States Office Action, U.S. Appl. No. 14/727,673, Mar. 23, 2016, 6 pages.

* cited by examiner

TIMING RECOVERY FOR DIGITAL RECEIVER WITH INTERLEAVED ANALOG-TO-DIGITAL CONVERTERS

CROSS REFERENCE TO RELATED APPLICATIONS

This application is a continuation of prior, co-pending U.S. application Ser. No. 14/727,673, filed Jun. 1, 2015, and entitled "Timing Recovery for Digital Receiver with Interleaved Analog-to-Digital Converters," which is incorporated herein by reference in its entirety for all purposes.

BACKGROUND

1. Field of Art

The disclosure generally relates to a receiver and, more specifically to a receiver having a phase control circuit to adjust the sampling clock of analog to digital converters.

2. Description of the Related Art

High speed communication systems transfer data over communication links at high data rates. The receiving devices in high speed communications systems can include analog to digital converters to convert the received analog signals into digital form for digital signal processing. As signaling speeds increase, the sampling phase of the analog to digital converter can have a significant effect on the receiver's ability to recover data from the analog signals.

SUMMARY

Embodiments of the present disclosure include a receiver having analog to digital converters with phase adjustable sampling clocks. The receiver includes a first analog to digital converter to convert an analog input signal into first digital samples controlled by a first sampling clock. A first clock generator adjusts a phase of the first sampling clock based on at least one first phase control signal. The receiver also includes a second analog to digital converter to convert the analog input signal into second digital samples controlled by a second sampling clock. A second clock generator adjusts the phase of the second sampling clock based on at least one second phase control signal. A data decision circuit recovers data based on the first and second digital samples. Feedback circuitry is coupled to receive the recovered data and generates at least one first phase control signal for the first clock generator and generates at least one second phase control signal for the second clock generator based on the first phase control signal.

In one embodiment, the feedback circuitry generates the at least one second phase control signal based on the first phase control signal and a set phase offset. In one embodiment, the feedback circuitry includes a timing error detector to generate at least one timing error signal indicating the timing error in the sampling of the analog input signal based on the recovered data. In this embodiment, the feedback circuitry generates the at least one second phase control signals based on the at least one first phase control signals and the at least one timing error signal. In one embodiment, a filter generates at least one filtered timing error signal based on the timing error signal and an accumulator generates the at least one first phase control signals by accumulating values of the filtered timing error signal over time.

In one embodiment, the feedback circuitry includes a timing error comparator to generate at least one delta timing error signal indicating a difference between the value of the timing error signal at a first time and at a second time. The feedback circuitry generates the at least one second phase control signal based on the at least one first phase control signal and the at least on delta timing error signal.

In one embodiment, the feedback circuitry includes a gain scaling circuit to generate at least one scaled timing error signal based on the delta timing error signal. The feedback circuitry further includes an accumulator circuit to generate at least one accumulation signal indicating the accumulation of the scaled timing error signal over time. The feedback circuitry generates the at least one phase control signal based on the at least one first control signal and the at least one accumulated error signal.

In one embodiment, the feedback circuitry generates the at least one second phase control signal by combining a value of the at least one first phase control signal with a value of the at least one accumulated error signal.

In one embodiment, the receiver includes a third analog to digital converter to convert the analog input signal into third digital samples controlled by a third sampling clock. A third clock generator adjusts a phase of the third sampling clock based on at least one third phase control signal. The feedback circuitry generates at least one third phase control signal based on the first phase control signal.

In one embodiment, the receiver includes a finite impulse response filter to generate filtered samples based on the first and second digital samples. The decision circuit recovers the filtered samples and the feedback circuitry generates the first phase control signal based on the filtered samples received from the decision circuit. In one embodiment, the feedback circuitry generates the first phase control signal based on the first and second digital samples.

In one embodiment, a method of operation is disclosed. The method includes converting an analog input signal into at least one first digital samples at timings controlled by a first sampling clock; converting the analog input signal into at least one second digital samples at timings controlled by a second sampling clock; recovering data based on the first and second digital samples; generating at least one first phase control signal based on the recovered data; adjusting a phase of the first sampling clock based on the at least one first phase control signal; generating at least one second phase control signal based on the at least one first phase signal; and adjusting a phase of the second sampling clock based on the at least one second phase control signal.

The features and advantages described in the specification are not all inclusive and, in particular, many additional features and advantages will be apparent to one of ordinary skill in the art in view of the drawings, specification, and claims. Moreover it should be noted that the language used in the specification has been principally selected for readability and instructional purposes only, and may not have been selected to delineate or circumscribe the inventive subject matter.

BRIEF DESCRIPTION OF DRAWINGS

The disclosed embodiments have advantages and features that will be more readily apparent from the detailed description, the appended claims, and the accompanying figures (or drawings). A brief introduction of the figures is below.

DETAILED DESCRIPTION

The Figures (FIGS.) and the following description relate to embodiments by way of illustration only. It should be noted that from the following discussion, alternative embodiments of the structures and methods disclosed herein will be readily recognized as viable alternatives that may be employed without departing from the principles of what is claimed. Reference will now be made in detail to several embodiments, examples of which are illustrated in the accompanying figures. It is noted that wherever practicable similar or like reference numbers may be used in the figures and may indicate similar or like functionality.

Figure 1:
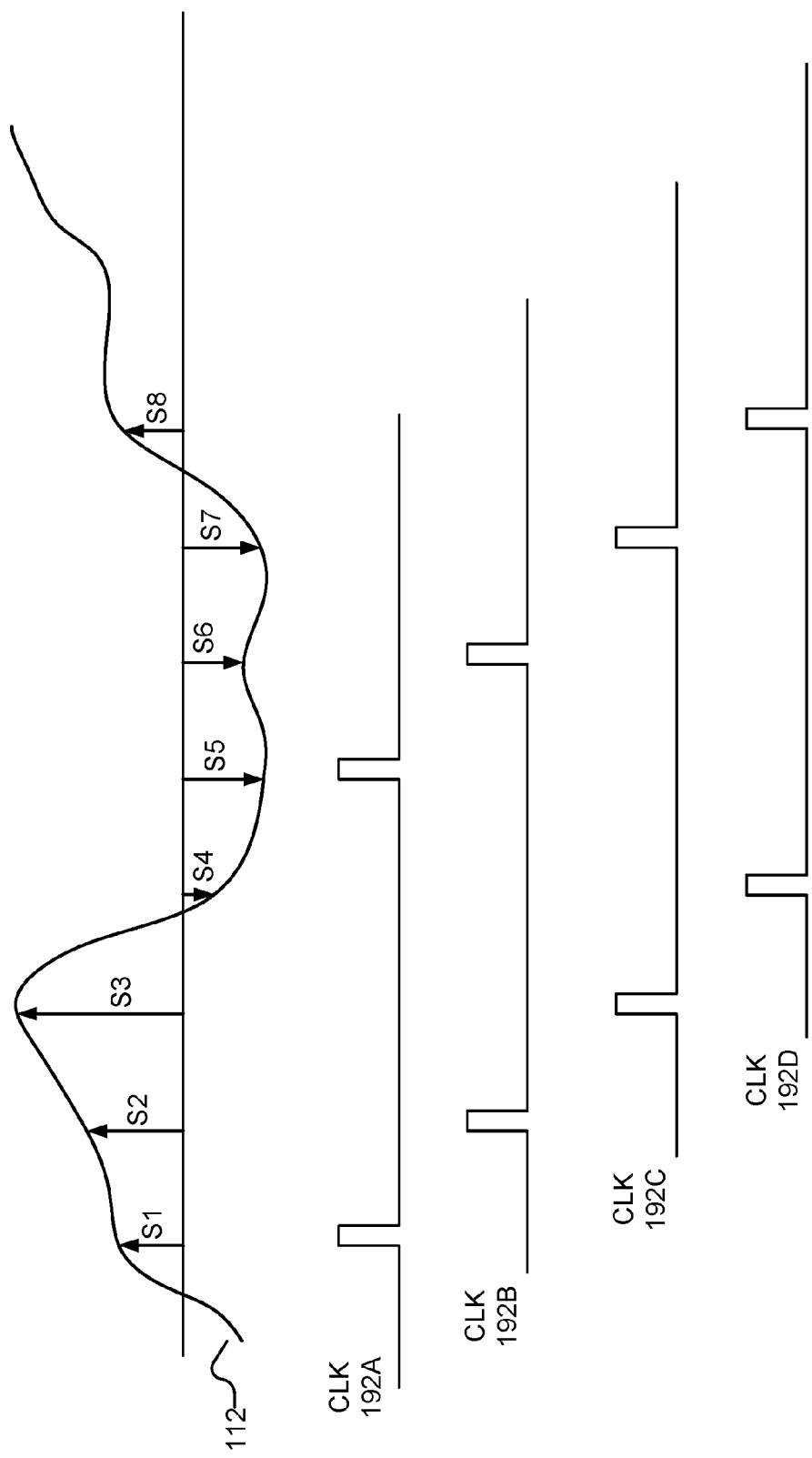
FIG. 1 illustrates sampling in the analog to digital converters in the receiver of FIG. 2, according to one embodiment.

FIG. 1 illustrates sampling in an analog to digital converter, according to one embodiment. FIG. 1 includes a plurality of waveforms. The top waveform is an analog input signal 112. The bottom waveforms show sampling clock 192A, 192B, 192C and 192D (hereinafter "sampling clocks 192") for different analog to digital converters. Each of the sampling clocks includes a series of periodic sampling pulses. Each time a sampling pulse occurs, the respective analog to digital converter samples the analog input signal 112, producing a series of samples S1-S8 from which data is recovered.

The data recovered from the samples S1-S8 is most accurate when the phase of sampling clocks 192 are set to ideal sampling phases relative to one another. However, in practice, the samples S1-S8 may be sampled at non-ideal phases due to changes in temperature, voltage, and other environmental conditions, thereby resulting in inaccurate recovered data. Embodiments of the present disclosure use interlocked feedback loops to adjust the phase of the sampling clocks 192 to their ideal sampling phase for recovering accurate data. In this embodiment, the time interval between samples S1-S8 may be the same, resulting in more accurate recovered data. In this embodiment, sampling clocks 192 operate at the same frequency and the relative delay among the sampling clocks 192 is maintained.

Figure 2:
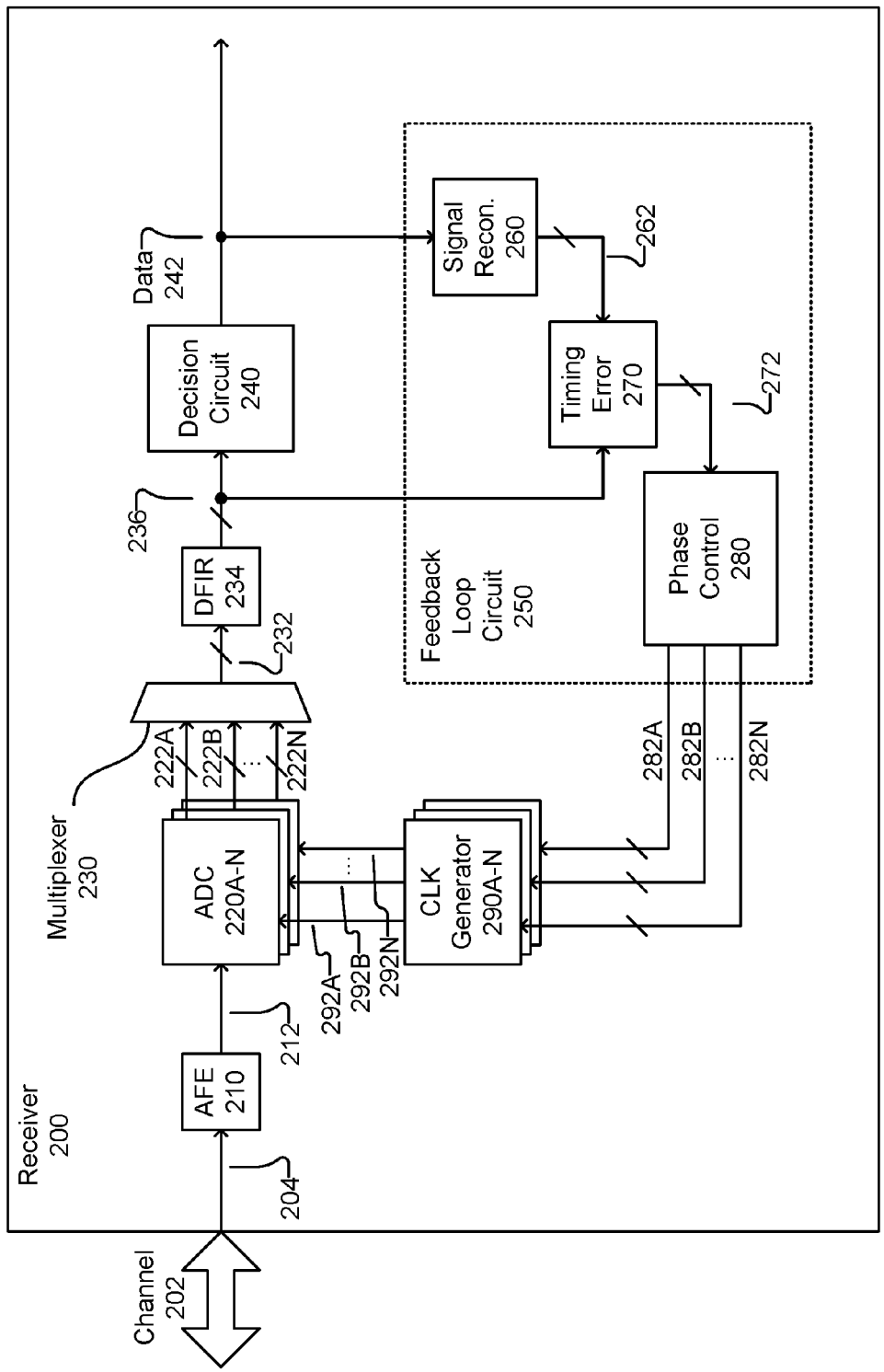
FIG. 2 is a high speed communication system that includes a receiver, according to an embodiment.

FIG. 2 is a high speed communication system that includes a receiver 200, according to one embodiment. The receiver 200 is coupled to a communications channel 202 and receives an analog channel signal 204 from a remote transmitter (not shown) through communications channel 202. The communications channel 202 can be, for example, a copper communication channel found in computing backplane that carries single ended or differential signals. The communications channel 202 can also be, for example, an optical communication channel.

The analog channel signal 204 is generated at the transmitter from digital data. The receiver 200 recovers digital data 242 from the channel signal 204. In some embodiments, the receiver 200 can be a standalone device or part of a larger device, such as an application specific integrated circuit (ASIC). The receiver 200 includes an analog front end (AFE) 210, analog to digital converters (ADCs) 220A-N, a multiplexer 230, a digital finite impulse response (DFIR) filter 234, a data decision circuit 240, a feedback loop circuit 250 and clock generators 290A-N. The feedback loop circuit 250 includes a signal reconstruction circuit 260, a timing error circuit 270 and a phase control circuit 280. Each of these components can be implemented with hardware circuits that generate signals, and the lines connecting the components carry signals from one component to the next.

The AFE 210 performs pre-processing on the received channel signal 204 using analog processing techniques to generate an analog input signal 212. The channel signal 204 can be non-ideal due to channel impairments, such as insertion loss, crosstalk, inter symbol interference and optical dispersion, and the AFE 210 uses analog processing to reduce some of these non-idealities. Examples of analog processing techniques include gain adjustment or continuous time equalization filters. In other embodiments, the AFE 210 can simply be an input terminal that receives the channel signal 204 and passes it on to generate the analog input signal 212 with no signal processing.

The input of the ADCs 220A-N are coupled to the output of AFE 210. Each ADC 220 converts analog input signal 212 into digital input samples 222 by sampling the analog input signal 212 and then rounding or quantizing the sampled input signal 212 to its closest digital value. Each digital value represents a different voltage level of the sampled input signal 212. Each ADC 220 outputs an M bit digital code in binary form.

The sampling phase of each ADC 220 is controlled by its own sampling clock signal 292. For example, ADC 220A generates samples 222A at a phase of sampling clock signal 292A, and ADC 220B generates samples 222B at a phase of sampling clock signal 292B. The sampling clocks signals 292A-N have different phases, which causes each ADC 220 to sample the analog input signal 212 at a different phase. The sampling clock signals 292A-N may appear, for example, like clock signals 192A-192D from FIG. 1.

The multiplexer 230 receives the digital input samples 222A-N from the ADCs 220A-N and selects one digital input sample 222A-N at a time for its output. The multiplexer 230 selects between the digital input samples 222A-N in round robin manner such that all the digital input samples 222A-N are interleaved together to form a continuous stream of digital samples. The stream of digital samples is output via digital input signals 232. In one embodiment, the digital samples 232 appear similar to the samples S1-S8 shown in FIG. 1.

DFIR filter 234 receives the digital input signals 232 that is indicative of the digital samples and filters the digital input signals 232 into filtered digital input signals 236. The DFIR filter 234 is a filter whose impulse response has finite duration. The DFIR filter 234 produces filtered digital input signals 236 having values that are equal to a weighted sum of the delayed samples indicated by digital input signals 232. The DFIR filter 234 can include a number of taps, where each tap represents a different delayed sample. Each tap is weighted and summed together to produce the filtered digital input signals 236. The number of taps and weights can vary depending on the tuning needs of the receiver 200.

The decision circuit 240 receives the filtered digital input signals 236 and makes a data decision on the logical data value represented by the digital samples of the filtered digital input signals 236, thereby recovering data 242. The recovered data 242 can be a single-bit data (e.g., NRZ) or multi-bit data (e.g., PAM-4). In one embodiment, the data decision circuit 240 includes a digital comparator that compares each value of filtered digital input signals 236 to a threshold value and uses the result of the comparison as the recovered data 242. In one embodiment, the data decision circuit 240 is a digital signal processor (DSP) that recovers data 242 from the filtered digital input signals 236 using digital signal processing algorithms. Examples of the data decision circuit 240 include adaptive equalizers, decision feedback equalizers (DFE) and maximum likelihood sequence detector (MLSD) (e.g., a Viterbi decoder). The data decision circuit 240 can also be referred to as a data recovery circuit.

The feedback loop circuit 250 is coupled to the outputs of the DFIR 234 and the data decision circuit 240. The feedback loop circuit 250 receives the filtered digital input signals 236 and the recovered data 242, and generates digital phase control signals 282A-N using these two inputs. At high speed signaling, the sampling phases of ADCs 220A-N can have a substantial effect on the accuracy of the data 242 recovered by the receiver 200. The feedback loop circuit 250 generates the digital phase control signals 282 through continuous and interlocking feedback to ensure that the phase of the sampling clock signals 292A-N is correct. As previously mentioned, the feedback loop circuit 250 can include the signal reconstruction circuit 260, the timing error circuit 270 and the phase control circuit 280.

The signal reconstruction circuit 260 receives the recovered data 242 and generates reconstructed digital input signals 262 from the recovered data 242. The reconstructed input signals 262 are a reconstructed and ideal version of the filtered digital input signals 236. In other words, the reconstructed input signals 262 represent ideal samples that are expected to be input to data decision circuit 240 if the sampling phase of the ADC 220 were ideal. If the phase of sampling clock signal 292 were at its ideal phase and resulted in ideal samples, the reconstructed input signals 262 would match exactly with the filtered digital input signals 236. However, when the phase of sampling clock signal 292 is not at the ideal phase, the reconstructed input signals 262 will be different than the filtered digital input signals 236. Reconstructed input signals 262 can also be referred to as reference signals or target signals.

The timing error detector 270 receives the filtered digital input signals 236 and the reconstructed input signals 262 and determines if there is a difference between the two types of signals. Timing error detector 270 generates digital timing error signals 272 that indicate the presence of and degree of timing error in sampling of the analog input signal 212. The timing error signals 272 can include a series of timing error values where each timing error value represents the timing error associated with the sampling phase of a particular ADC 220.

In one embodiment, timing error detector 270 is a type of minimum mean square error (MMSE) detector. The MMSE detector determines a mean square error (MES) between the filtered digital input signals 236 and the reconstructed input signals 262. The MMSE detector then computes a gradient (i.e., slope) of the MSE over time and outputs timing error signals 272 that are indicative of a gradient of the MSE relative to a phase timing error. The gradient represents a direction in which the MSE is moving and how fast the MSE is moving in that direction.

The phase control circuit 280 receives and processes the timing error signals 272 to generate the digital phase control signals 282A-N. Each of the digital phase control signals 282A-N includes a phase control value representing a target phase of a respective sampling clock signals 292A-N. The phase control circuit 280 includes interlocking feedback paths (not shown) that use one of the digital phase control signals 282N in generating the other digital phase control signals 282A-M, as will be explained in greater detail by reference to FIG. 5. The interlocking paths enable digital phase control signals 282A-N to settle to their proper values within a short amount of time.

The clock generators 290A-N generate the sampling clock signals 292A-N based on the digital phase control signals 282A-N. Specifically, the clock generators 290A-N adjust a phase of the sampling clock signals 292A-N in accordance with the phase control values of the digital phase control signals 282A-N. In one embodiment, the clock generators 290A-N are phase interpolators that move the pulses of the sampling clock signals 292A-N forward or backwards in time. For example, if digital phase control signal 282A changes values from "7" to "8," the clock generator 290A can move the pulses of the sampling clock signal 292A in a direction that increases a phase delay of the sampling clock signal 292A. The phase of the sampling clock signals 292A-N is adjusted to reach a steady state during which the filtered timing error signals 272 have a mean value of zero.

Figure 3:
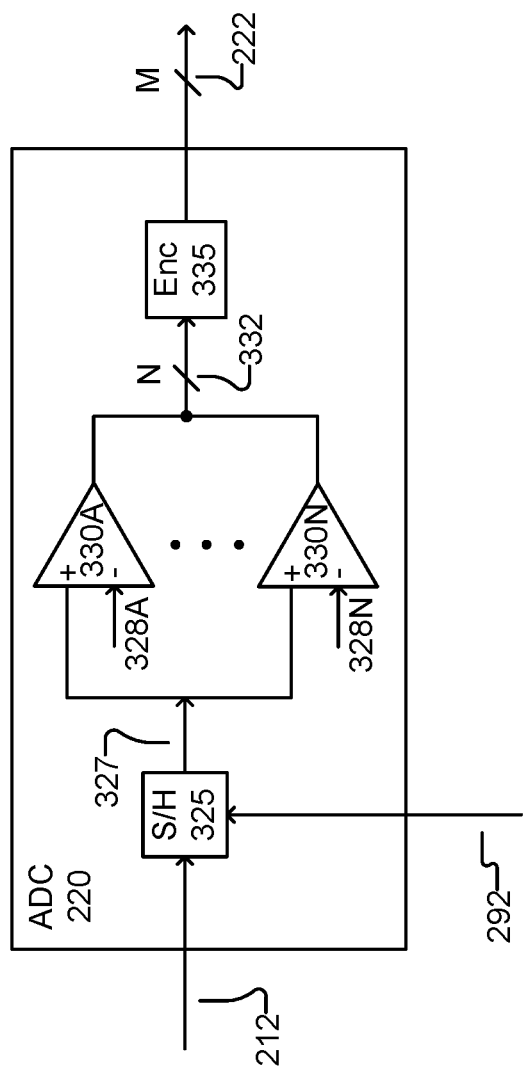
FIG. 3 is a detailed block diagram of an analog to digital converter in the receiver of FIG. 2, according to an embodiment.

FIG. 3 is an example of ADC 220, according to one embodiment. Each ADC 220 includes a sample and hold circuit 325, a comparator array 330, and an encoder 335. The sample and hold circuit 325 periodically samples the voltage level of the analog input signal 212 and generates a sampled input signal 327 as a result of the sampling. The sample and hold circuit 325 can be implemented by a switch connected to a capacitor. When the switch is closed, the capacitor is charged to the voltage level of the input signal 212. When the switch is opened, the capacitor holds the voltage level that it is charged to.

The sampling phase of the sample and hold circuit is controlled by pulses of the sampling clock signal 292. When the sampling clock signal 292 logic is high, the sample and hold circuit 325 samples the input signal 212. When the sampling clock signal 292 logic is low, the sample and hold circuit 325 holds the sampled value constant.

The comparator array 330 includes N comparators that perform analog to digital conversion by comparing sampled input signal 327 to N reference voltages 328. The output of the comparator array 330 is an N bit digital thermometer code 332. The thermometer to binary encoder circuit 335 uses the thermometer-to-binary encoding to convert the N bit thermometer code 332 into an M bit digital code in binary form using logic gates. The M bit digital code forms a digital input sample 222.

Figure 4B:
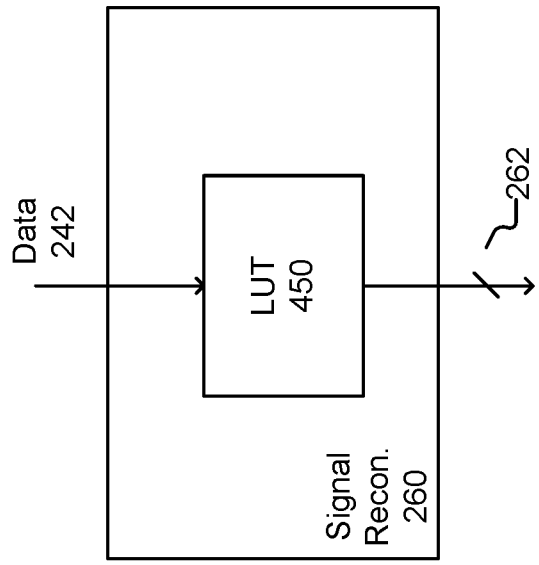
FIG. 4B is an example of a signal reconstruction circuit in the receiver of FIG. 2, according to another embodiment.
Figure 4A:
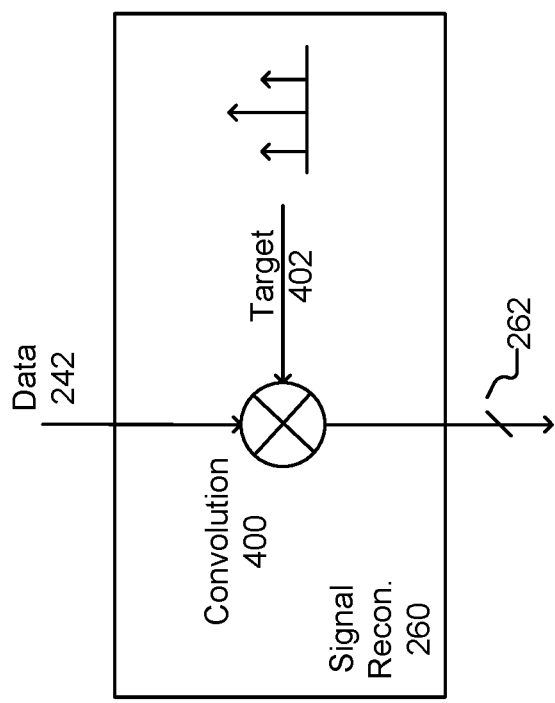
FIG. 4A is an example of a signal reconstruction circuit in the receiver of FIG. 2, according to an embodiment.

FIG. 4A is an example of the signal reconstruction circuit 260 in the receiver 200 of FIG. 2, according to one embodiment. As shown, the signal reconstruction circuit 260 includes a convolution circuit 400. The convolution circuit 400 convolves a sequence of recovered data 242 with a sequence of convolution target values 402 (e.g., [1 1] or [1 2 1]). The convolution target values 402 can be pre-determined values that are set based on known characteristics of channel 202. Alternatively, the convolution target values 402 can be adaptive and change over time. The convolution produces digital codes that are used as the reconstructed input signals 262. Each code represents an input sample that would be captured at an ideal sampling time.

FIG. 4B is an example of the signal reconstruction circuit 260 in the receiver 200 of FIG. 2, according to another embodiment. As shown, the signal reconstruction circuit 260 includes a look up table (LUT) 450. The LUT 450 references sequences of recovered data 242 to values of the reconstructed input signals 262. The values of the reconstructed input signals 262 in the LUT 450 can be implemented by a pre-computed convolution function or some other type of function. For example, the LUT 450 can be programmed with a values that imitate a non-linearly effect in the receiver circuitry. The recovered data 242 is provided to the LUT 450, which then outputs the appropriate values for the reconstructed input signals 262.

Figure 5:
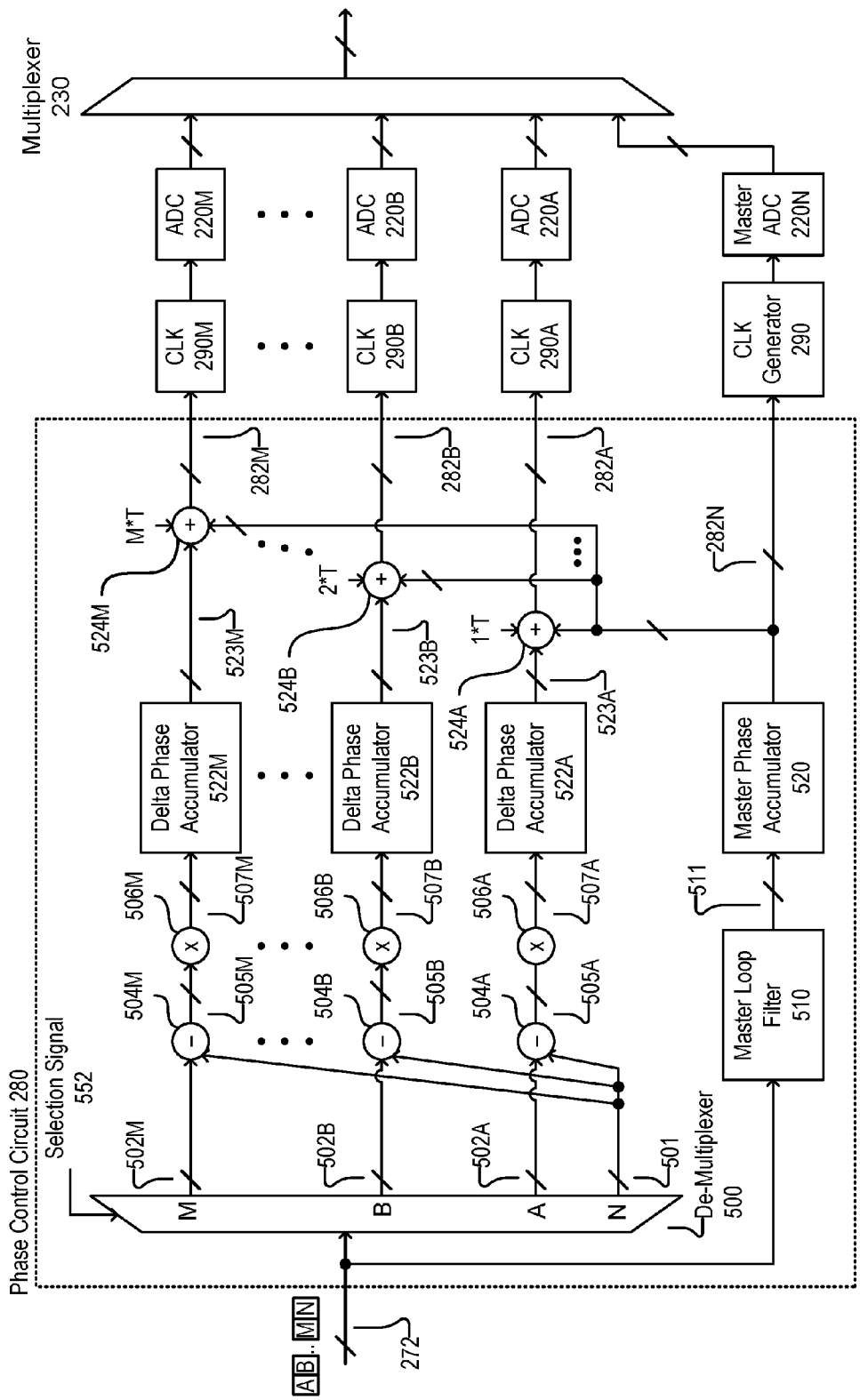
FIG. 5 is a detailed block diagram of a phase control circuit in the feedback loop circuit in the receiver of FIG. 2, according to an embodiment.

FIG. 5 is an example of phase control circuit 280 in the feedback loop circuit 250 in the receiver 200 of FIG. 2, according to one embodiment. The phase control circuit 280 can include de-multiplexer 500, timing error comparators 504A-M (hereinafter referred to as "timing error comparators 504"), gain scaling circuit 506A-M (hereinafter referred to as "gain scaling circuits 506"), master loop filter 510, master phase accumulator 520, delta phase accumulator 522A-M (hereinafter referred to as "delta phase accumulators 522"), and phase offset adjustment circuits 524A-M (hereinafter referred to as "phase offset adjustment circuits 524").

Figure 6:
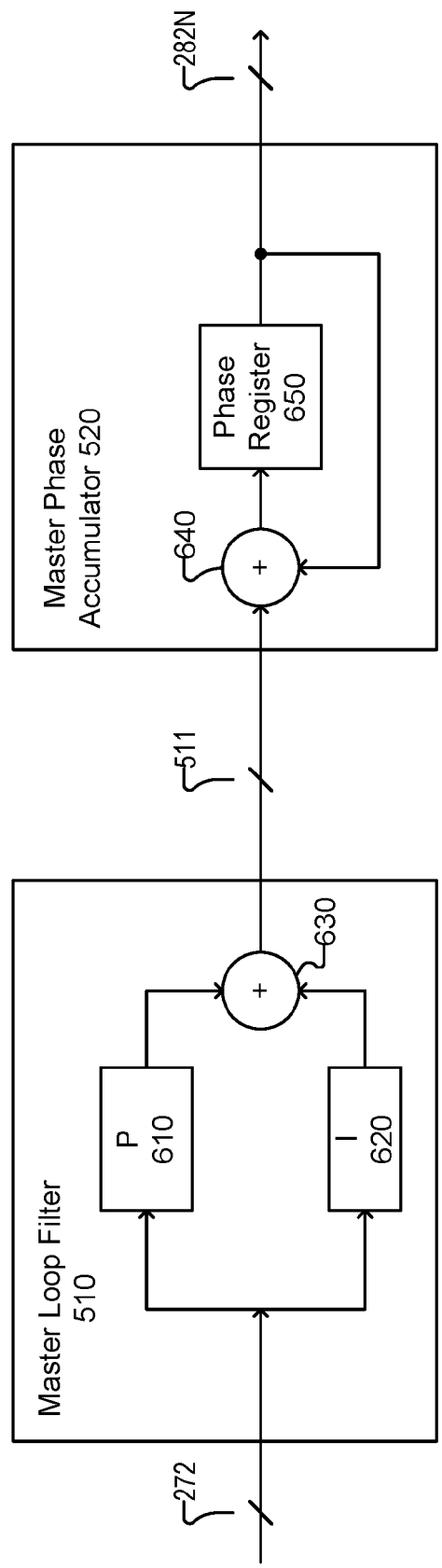
FIG. 6 is a detailed block diagram of a master loop filter and a master phase accumulator in the phase control circuit of FIG. 5, according to an embodiment.

The master loop filter 510 filters the digital timing error signals 272 into filtered digital timing error signals 511. As illustrated in FIG. 6, master loop filter can be implemented as a proportional-integral term of a PID controller. A proportional calculation circuit 610 multiplies values of the digital timing error signals 272 by a constant. The integral calculation circuit 620 integrates values of the digital timing error signals 272. The proportional and integrated portions are summed together by adder circuit 630 to produce the filtered timing error signals 511.

The master phase accumulator 520 receives the filtered digital timing error signals 511 and generates master digital phase control signal 282N by accumulating timing error values of the one or more filtered timing error signals 511 over time. As illustrated in FIG. 6, master phase accumulator 520 can include an adder circuit 640 and a phase register 650. The phase register 650 stores a current phase control setting. The adder circuit 640 updates the phase control setting by adding values of the filtered timing error signals 511 to the current phase control setting. The phase register 650 then outputs its stored phase control setting through the master digital phase control signal 282N. Thus, when the filtered timing error signals 511 have a value of "0," the current phase control setting is maintained without change.

Referring back to FIG. 5, the master loop filter 510 and master phase accumulator 520 form a master feedback path that generates master digital phase control signal 282N. The upper feedback paths receive the master digital phase control signal 282N and generate the other phase control signals 282A-M relative to the phase control value indicated by the master digital phase control signal 282N. The upper feedback paths are thus interlocked with and dependent on the result produced by the lower feedback path. In practice, the master digital phase control signal 282N will converge quickly to a phase control value, and the other phase control signals 282A-M will follow the master digital phase control signal 282N by converging on their respective phase control values.

As shown, the de-multiplexer 500 receives digital timing error signals 272 and de-multiplexes the digital timing error signals 272 into master timing error signal 501 and secondary timing error signals 502A-M (hereinafter referred to as "secondary timing error signals 502"). The timing error signals 272 include a series of timing error values. Each timing error value represents the timing error associated with the sampling phase of a particular ADC 220. The timing error values are de-multiplexed in circular round robin manner into the master timing error signal 501 and the secondary error signals 502.

The timing error values are effectively routed to the feedback path leading to its associated ADC 220, with the exception of the master ADC 220N. For example, timing error value at position "A" is the provided to secondary timing error signal 502A. Timing error value at position "B" becomes secondary timing error signal 502B. The timing error value at position "M" is provided to secondary timing error signal 502M. The timing error value at position "N" is routed to master timing error signal 501.

Each timing error comparator 504 receives the master timing error signal 501 and a respective secondary timing error signal 502. The timing error comparators 504 compare the received signals to determine the difference between timing error values in the received signals 501 and 502A-M to produce delta timing error signals 505A-M (hereinafter referred to as "delta timing error signals 505"). For example, timing error comparator 504A determines the difference between a timing error value of the master timing error signal 501 and a timing error value of secondary timing error signal 502A to produce a set of delta timing error signals 505A. The value of each set of delta timing error signals 505 indicates a delta or difference (i.e. sign and magnitude) between a timing error for a sampling phase of secondary ADC 220 relative to a timing error for the sampling phase of the master ADC 220N.

The gain scaling circuits 506 receive the delta timing error signals 505 and scale the delta timing error signals 505 to produce scaled delta timing error signals 507A-M (hereinafter referred to as "scaled delta timing error signals 507"). Gain scaling circuits 506 may multiply values of the delta timing error signals 505 by a pre-determined constant to produce scaled delta timing error signals 507 having scaled delta timing error values.

The delta phase accumulators 522 receive scaled delta timing error signals 507 and generate accumulated delta timing error signals 523A-M (hereinafter referred to as "accumulation signals 523") indicative of accumulations of the scaled delta timing error values over time. In one embodiment, delta phase accumulators 522 are implemented with circuits similar to master phase accumulator 520 illustrated in FIG. 6.

The phase offset circuits 524 each receive three inputs: the master phase control signals 282N, a corresponding set of accumulation signals 523 and a corresponding phase offset value (1*T, 2*T, M*T). The phase offset value is a pre-determined value that is a multiple of a base phase offset value T.

The phase offset circuits 524 combine the master phase control value of the master phase control signals 282N with an accumulation value of a corresponding set of accumulation signals 523A-M and a corresponding target phase offset value (1*T, 2*T, M*T). The combination results in a secondary phase control value. The secondary phase control value is then output via a corresponding set of phase control signals 282A-M.

The secondary phase control values thus represent clock phase settings that are phase offset from the master phase control values. The degree of the phase offset is roughly set in accordance with the phase offset values (1*T, 2*T, M*T). The degree of the phase offset is then fine-tuned with the accumulated delta timing error signals 523 generated along the secondary feedback paths.

Figure 7:
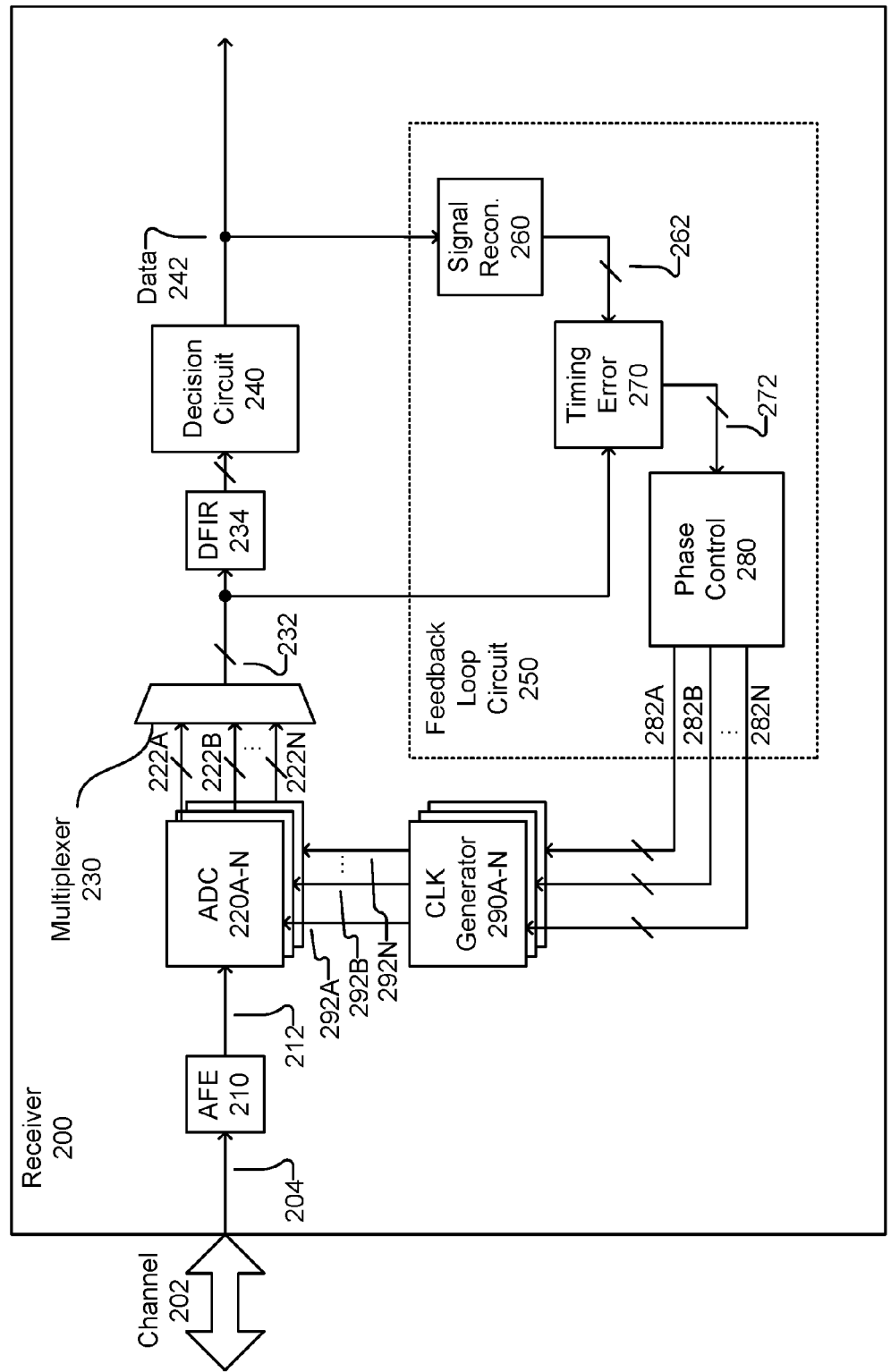
FIG. 7 is a high speed communication system that includes a receiver, according to another embodiment.

FIG. 7 is a high speed communication system that includes a receiver 200, according to another embodiment.

The feedback loop circuit 250 illustrated in FIG. 7 is similar to the feedback loop circuit 250 illustrated in FIG. 2. The main difference of the feedback loop circuit 250 of FIG. 7 is that feedback loop circuit 250 is connected to the input of the DFIR 234 and directly receives the digital input signals 232 indicative of the digital input samples. The timing error circuit 270 then generates the timing error signals 272 directly from the digital samples carried by the digital input signals 232.

In one embodiment, a representation of the receiver or components within the receiver may be stored as data in a non-transitory computer-readable medium (e.g. hard disk drive, flash drive, optical drive). These representations may be, for example, behavioral level, register transfer level, logic component level, transistor level and layout geometry-level descriptions of the receiver.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a receiver having ADCs with an adjustable sampling clock through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A receiver comprising:
   a first analog to digital converter (ADC) circuit to convert an analog input signal into first digital samples;
   a second ADC circuit to convert the analog input signal into second digital samples;
   a finite impulse response filter to generate filtered samples based on the first digital samples and the second digital samples,
   a decision circuit to recover data based on the filtered samples; and
   circuitry to receive the filtered samples and to generate one or more control signals affecting operation of at least one of the first ADC or second ADC based on the filtered samples.

2. The receiver of claim 1, wherein the one or more control signals include a first control signal affecting a sampling phase of the first ADC and second signal control signal affecting a sampling phase of the second ADC.

3. The receiver of claim 1, wherein the circuitry generates the one or more control signals further based on the recovered data.

4. The receiver of claim 1, wherein the circuitry comprises:
   a timing error detector circuit to generate, based on the recovered data, one or more timing error signals indicative of a timing error in sampling of the analog input signal,
   wherein the circuitry generates the one or more control signals further based on the one or more timing error signals.

5. The receiver of claim 1, wherein a sampling phase of the first ADC circuit is different from a sampling phase of the second ADC circuit.

6. A method of operation of a receiver, comprising:
   converting an analog input signal into first digital samples with a first analog to digital converter (ADC);
   converting the analog input signal into second digital samples with a second ADC;
   generating filtered samples based on the first digital samples and the second digital samples;
   recovering data based on the filtered samples; and
   generating one or more control signals affecting operation of at least one of the first ADC or second ADC based on the filtered samples.

7. The method of claim 6, wherein the one or more control signals include a first control signal affecting a sampling phase of the first ADC and a second control signal affecting a sampling phase of the second ADC.

8. The method of claim 6, wherein the one or more control signals are generated further based on the recovered data.

9. The method of claim 6, further comprising:
generating, based on the recovered data, one or more timing error signals indicative of timing error in sampling of the analog input signal,
wherein generating the one or more second control signals is further based on the one or more timing error signals.

* * * * *